United States Patent [19]

Scheftic et al.

[11] Patent Number: 5,200,640
[45] Date of Patent: Apr. 6, 1993

[54] HERMETIC PACKAGE HAVING COVERS AND A BASE PROVIDING FOR DIRECT ELECTRICAL CONNECTION

[75] Inventors: David J. Scheftic, South Waverly, Pa.; William A. Peterson, Vestal, N.Y.; John E. Escallier, Selden, N.Y.; Hanna E. Rykowska, Deer Park, N.Y.

[73] Assignees: Electron Power Inc., Deer Park; General Electric Company, Johnson City, both of N.Y.

[21] Appl. No.: 743,986

[22] Filed: Aug. 12, 1991

[51] Int. Cl.⁵ .................. H01L 23/02; H01L 23/12
[52] U.S. Cl. .......................... 257/693; 257/730
[58] Field of Search .................... 357/74, 75, 71; 174/52.4

[56] References Cited

U.S. PATENT DOCUMENTS 3,908,185  9/1975  Martin .................. 357/74
4,992,628  2/1991  Beppu et al. .......... 174/52.4
5,013,871  5/1991  Mahulikar et al. ..... 174/52.4
5,023,398  6/1991  Mahulikar et al. ..... 174/52.4
5,103,292  3/1992  Mahulikar .............. 357/74

Primary Examiner—Jerome Jackson, Jr.
Assistant Examiner—D. Monin
Attorney, Agent, or Firm—Bernard E. Shay; Sephen A. Young

[57] ABSTRACT

The invention relates to the hermetic packaging of typically one or two dice for high power density applications. The package, which is intended for surface mounting to a heating sinking substrate, is particularly compact. Compactness in surface mount applications is measured as a minimum ratio of package area to die area. In accordance with the invention, compactness is achieved by using a novel vertically developed design in which the electrical connections lie within vertical extensions of the die boundaries giving a package to die ratio of less than 2 to 1.

16 Claims, 2 Drawing Sheets

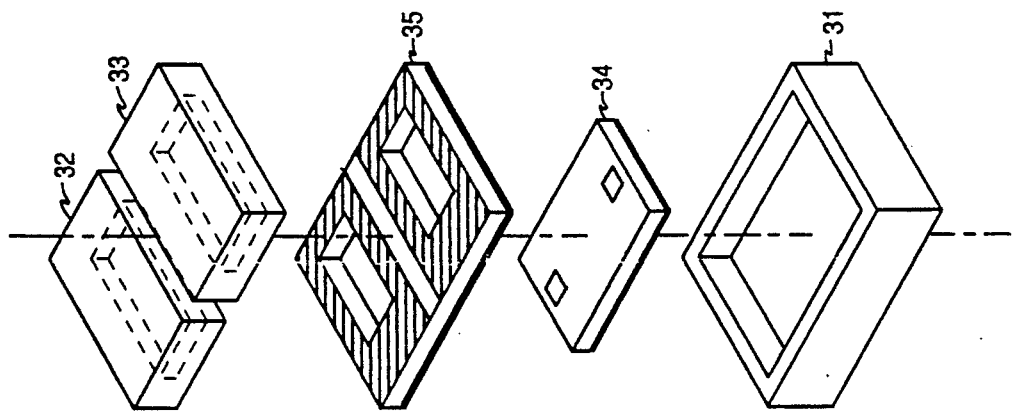
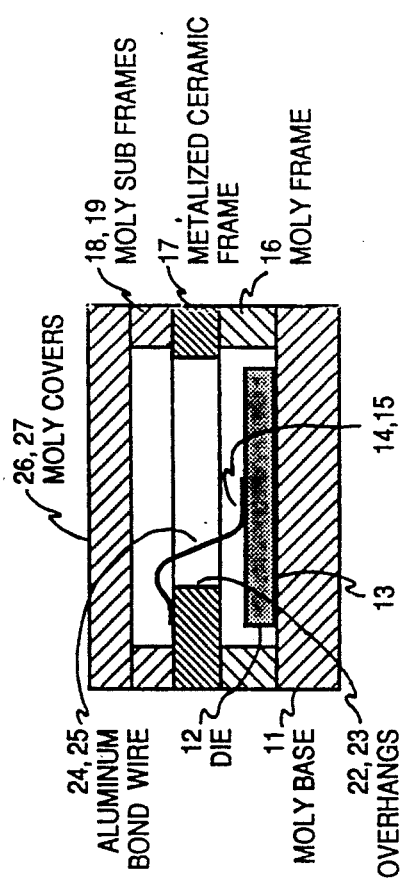

HERMETIC PACKAGE HAVING COVERS AND A BASE PROVIDING FOR DIRECT ELECTRICAL CONNECTION

BACKGROUND OF THE INVENTION

1. Field of the invention

The invention relates to the hermetic packaging of semiconductor devices, and more particularly to compact hermetic packaging suitable for surface mounting semiconductor devices upon a heat sinking substrate.

2. Prior Art

At the present, the packaging of semiconductor devices is the subject of continuing evolution in the direction of achieving increased power densities. An approach presently favored is that of surface mounting the components upon a heat sinking substrate. The active devices generate heat as an incident to their performance of the electronic functions. The heat sinking substrate conducts heat generated in the active devices away from the active devices to a heat exchanger. The cooling path cools the active devices, holding local temperatures within the active devices to values low enough to prevent damage or impair their performance.

In the surface mount approach, one measure of packaging economy, given that the available height between substrates is fixed, is the ratio of package area to the active device area. To illustrate the improvement in packaging economy using an area measure, the very common TO-3 case for an active semiconductor device requires approximately three times the area of a known surface mount package for the same active device. Among surface mount constructions, several examples are known. One known package, for instance, has external area dimensions of 0.625"×0.450" and exhibits a ratio of package area to chip area of 4.0 to one. Another known surface mount package provides a ratio of package area to chip area of 3.66 to one. The present invention is directed to achieving a lower ratio of package area to chip area, preferably of 2 to 1 or below.

SUMMARY OF THE INVENTION

Accordingly, it is an object of the present invention to provide an improved hermetic surface mount package for a semiconductor device.

It is still another object to provide a hermetic surface mount package for a semiconductor device having a reduced ratio of package area to device area.

It is a further object to provide a hermetic surface mount package for a semiconductor device tolerant to high temperature bonding when electrical and thermal connections are subsequently made.

These and other objects of the invention are achieved in a novel combination including a die of semiconductor material and a hermetic surface mount package for the die.

The package can contain one die or two dice, usually a three electrode transistor or two diodes. In each case, one under surface contact and two upper surface contacts are required for electrical connection.

The novel hermetic surface mount package is of a vertically developed five layer structure starting with a metal base to which the die is attached (assuming a single three electrode device is employed). The second layer is an apertured frame sealed to the base to create a recess dimensioned to accommodate the die. The third layer is a ceramic frame having two apertures for upward passage of bond wires from the die and includes overhangs adjacent each aperture for bond wire attachment. The ceramic frame is sealed on the under surface to the first frame and is separately sealed on its upper surface to two subframes forming the fourth layer.

Two bond wires connect upper surface contacts on the die to the upper surface metallizations on the overhangs of the ceramic frame.

The two apertured metallic subframes sealed between the upper surface of the ceramic frame and the cover, forming the fifth layer, provide recesses for accommodating the bonds made to the ceramic frame.

When the covers are sealed to the subframe the package is closed about the active device. The subframe covers and base provide three electrical connections to the semiconductor device.

In a preferred embodiment the base, first frame, the subframes and covers are of molybdenum, while the ceramic frame is of alumina.

In accordance with a second embodiment of the invention, a deformable metal is used and recesses to accommodate the die and wire bonds are created by a stamping process. The preferred material is a copper alloy.

The described vertical development of the surface mount package, allows the contacts to be arranged on surfaces overhanging the die. This practice allows the package area to approach the area of the active device, without requiring package area to be devoted to contacts, leading to a very compact design.

BRIEF DESCRIPTION OF THE INVENTION

The inventive and distinctive features of the invention are set forth in the claims of the present application. The invention itself, however, taken with further objects and advantages thereof may best be understood by reference to the following description and accompanying drawings, in which:

FIG. 1 is a cross-section of a compact hermetic package for a semiconductor device in accordance with a first embodiment of the invention;

FIG. 3 is an exploded isometric view of a second embodiment of the invention.

DESCRIPTION OF THE PREFERRED EMBODIMENT

Figure 2:
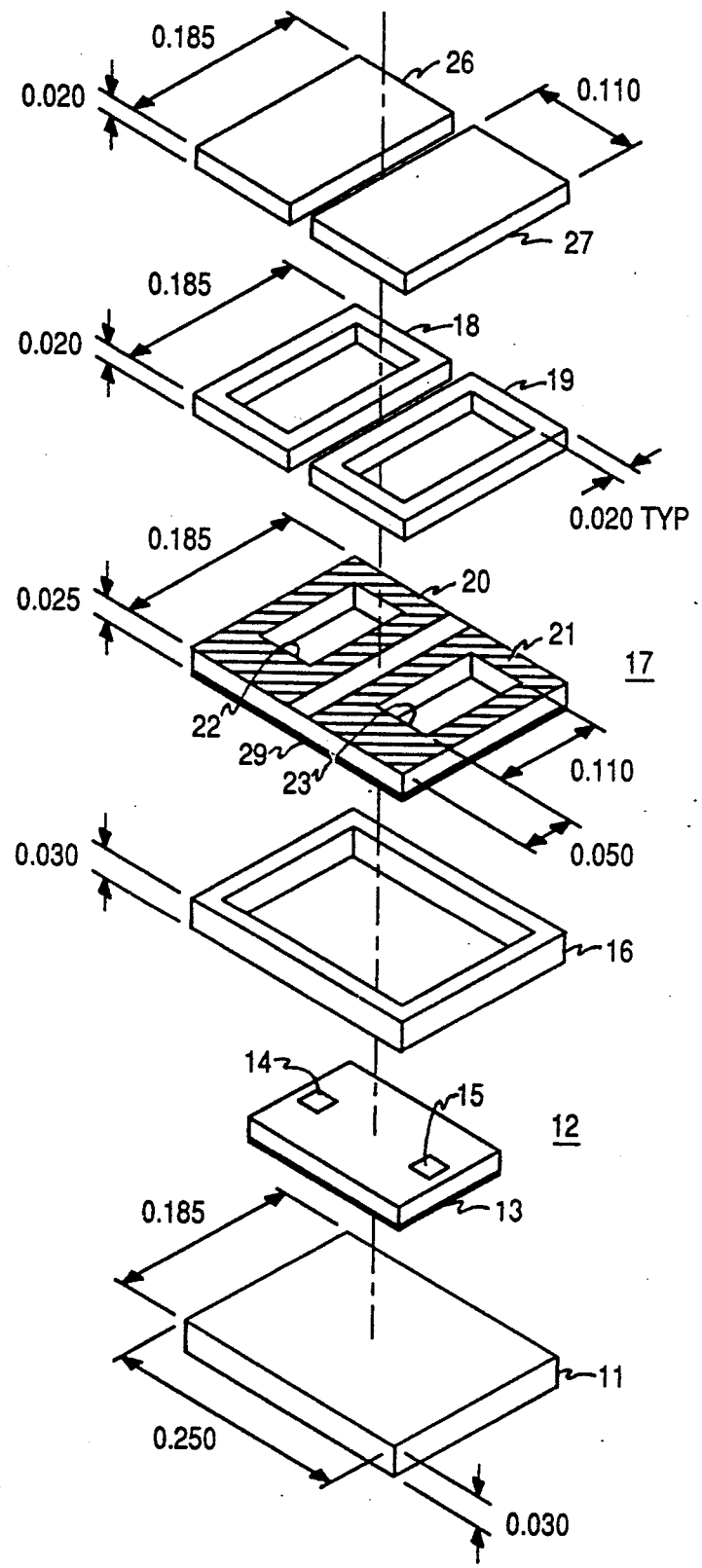
FIG. 2 is an exploded isometric view of the hermetic package in accordance with said first embodiment.

A novel compact hermetic surface mount package for semiconductor power devices in accordance with a first embodiment of the invention is shown in FIGS. 1 and 2. The package is designed for use in high density power supply modules of typically 40-60 watts. The package is compact so as to provide efficient use of volume in a power supply module in which a density of 50 watts per cubic inch is the objective. In accordance with surface mount packaging, the package is designed to be soldered to a heat sinking substrate (not shown). The heat sinking substrate provides an electrical connection and a thermally conductive path for removing heat from this and other surface mounted packages and for conducting the heat removed to a heat exchanger.

The package depicted in FIGS. 1 and 2 is designed to accommodate either a pair of Schottky diodes or a single MOSFET power device and provides three electrical contacts. The package will accommodate one die for the MOSFET device (as illustrated in FIG. 2) or two dice for the two Schottky diodes. In both examples the package provides means for making one under surface contact and two upper surface contacts. In the case of a pair of Schottky diodes, one pair of like electrodes is connected together and requires one under surface contact, and the other pair of electrodes are connected separately and require two upper surface contacts. In the case of the MOSFET power transistor, the drain is attached to the under surface contact and the source and gate pads require the two upper surface contacts.

As shown in the exploded view of FIG. 2, the package is an assembly of seven parts assembled in a five layer vertical stack beginning with a molybdenum base 11 forming the first layer. The single die 12, embodies a MOSFET power device. The die is bonded to the base 11 and successive members of the hermetic package bonded to the base complete the enclosure about the die. The die, as illustrated in FIG. 2, has a metallized under surface 13, suited for solder bonding to the base 11 which provides the under surface contact to the die. The upper surface of the die contains two spaced electrical pads 14 and 15 suited for conventional wire bonding.

The members making up the remainder of the five layer package include a molybdenum frame 16 making up the second layer. The frame 16 has a single rectangular aperture large enough in height, width and depth to accommodate the die.

A ceramic frame 17 makes up the third layer of the package. The ceramic frame has two spaced metallizations 20, 21 on its upper surface surrounding two smaller rectangular apertures and a third metallization 29 on its under surface for sealing to the walls of the aperture in the frame 16. The smaller apertures provide space for upward passage of bond wires 24, 25 from the device contacts 14, 15. The ceramic frame 17 is dimensioned to provide overhangs 22 and 23 adjacent each of the smaller apertures and overhanging the die 12 for bond wire attachment. The metallizations 20, 21 coating the upper surface of the ceramic frame along the walls of the second and third apertures to form a seal to the subframes 18 and 19, and also coat the overhangs 22 and 23 for the wire bonds.

The fourth layer of the vertical stack is provided by two metallic subframes 18, 19. These are attached in a mutually spaced relationship to the upper surface metallizations 20, 21 and become part of the electrical contact structure of the package. Each of the two subframes has a rectangular aperture aligned with the two apertures in the ceramic frame 17 and each is dimensioned to accommodate a wire bond (24, 25) applied to the overhangs 22, 23 of the ceramic frame 17.

As shown in the exploded view of FIG. 2, the metallizations 20, 21 on the ceramic frame 17 are spaced allowing the metallic subframes 18, 19, which are bonded to these metallizations, to be electrically isolated. In addition, the overhangs 22, 23 (i.e. areas on the ceramic frame 17 which lie within vertical extensions of the boundaries of the die 12) for wire bond attachment, tend to limit the increase in package area over that of the die alone primarily to the thickness of the walls of the aperture accommodating the die and the small oversizing of the aperture necessary for practical assembly. Thus in accordance with the invention, the package area need not be increased to include additional area for contacts placed to one side of the semiconductor die. By the vertically developed design, the ratio of package area to die area is minimized.

A pair of bond wires 24, 25, which pass through the apertures are then attached between the surface contacts 14, 15 on the die and the bonding areas 22, 23 on the ceramic frame 17.

Once the wire bonds are made, the metallic covers 26, 27 which form the fifth and last layer of the package may be sealed to the subframes. This completes the hermetic enclosure about the die and provides three mutually isolated, solderable, electrical contacts to the die.

The compact package is 125 mils in height and 185 by 250 mils in area. The height of the metallic frame 16, which is 30 mils, is designed to create a recess adequate to accommodate a die thickness of 10-15 mils. The ceramic frame 17 is 25 mils thick, and the subframes 18 and 19 are 20 mils thick, creating two recesses within the package adequate to house the vertical bonds between pads 14 and 1 and the overhangs 22 and 23 respectively. The arrangement thus has the advantage of being very saving in area for surface mount applications, and is also of very limited volume.

Since each of the assembly steps entails a hermetic seal, the complete package is hermetically sealed when assembly is completed. In the preferred embodiment, the metallic base 11, frame 16, subframes 18, 19, and covers 26 and 27 are of molybdenum. Molybdenum has good thermal and electrical conductivity. The ceramic frame 17 is of alumina. The semiconductor die may be silicon or Gallium Arsenide. These materials have compatible coefficients of thermal expansion and are bonded together in an industry standard manner which accommodates the slight CTE mismatches which may occur and which provides a serviceable hermetic seal.

For assembly, the surfaces of the molybdenum and alumina members are treated to facilitate sealing. The surfaces of the molybdenum parts are first nickel plated and then gold plated. The MOSFET die 12 and the molybdenum frame 16 are then soldered directly to the base 11 using a gold germanium solder. Next the molybdenum subframes 18, 19 are bonded to the metallized alumina frame. The metallized alumina frame has the three isolated metallizations (noted earlier) for bonding. The two upper surface metallizations (20, 21) provide surfaces for bonding the alumina to the molybdenum subframes 18 and 19. The molybdenum subframes 18 and 19 are bonded to the alumina using a high temperature silver glass adhesive. The silver glass adhesive was chosen for its high firing temperature and low flow properties. The low flow properties are necessary to prevent contamination of the wire bond sites provided for the gate and source contacts on the die. The under surface metallization 29 provides a surface for bonding the alumina to the molybdenum frame 16. The molybdenum frame 16 is soldered to the undersurface metallization 29 using 95/5 lead/tin solder.

After assembling the alumina frame 17 and subframes 18, 19 to the base assembly 11, 16, the bond wires are attached. Ultrasonic aluminum wire bonding is used if the die is provided with an aluminum metallization for the pads 14, 15. A soldered assembly is used if solderable metallizations for the pads are employed.

The package assembled in the foregoing manner is hermetic, and serviceable. The package may be subsequently processed at temperatures in excess of 260° C. and has been designed to withstand 1000 temperature cycles between −55° and 125° C.

The compact package just described significantly reduces the required circuit board area by employing over-the-die wire bonds and vertically developed conduction paths. The area ratio of package to die is approximately 2 to 1 in the disclosed embodiment. The improvement of area ratio is primarily attributable to the overhanging construction of the alumina frame 17. This eliminates the need for gate and source wire bond sites arranged adjacent to the die as in prior art approaches. Over-the-Die wire bond with the vertically developed conduction paths provides a saving in area of about 30 percent. A second advantage of the arrangement is that the bond wires become very short, approximately one-third the length of a conventional approach, and their self inductance is reduced. Since the package materials are all non-magnetic, the self inductances are not increased by proximity to magnetic materials.

Summarizing, the assembly method which has just been described departs from the more standard approach in which one starts with a substantially completed package, inserts the semiconductor device into the package and then after die bonding, seals the package around the die. In the present approach, the first step in the process is attaching the die to the base member of the package and then continuing the construction of the package around the die until the die is fully enclosed. The package illustrated is designed to accommodate two 0.09 inch rectifier dice or up to a size 3 MOSFET power transistor.

FIG. 3 is a view of a second embodiment of the invention in which a single recessed base 31 replaces both the base 11 and metallic frame 16 of the first embodiment. Similarly, recessed covers 32 and 33 replace respectively the subframe 18 and cover 26; and the subframe 19 and cover 27. The recessed base member 1 provides a recess of the same dimensions as the members 11 and 16 in the first embodiment and is designed to accept a die 34 in the same manner as in the first embodiment. The ceramic frame 35 is of the same configuration as the ceramic frame 17 of the first embodiment. The recessed covers 32 and 33 provide recesses in the same manner as in the first embodiment, and the space allowed for the bonds, and the bond wires are also as before.

The recessed base 31 and recessed covers 32 and 33, which are of a stamped or forged construction are of a deformable material which may be stamped or forged. The material must also have the good electrical and thermal conductivity, compatible coefficients of thermal expansion. The material must also be suitable for conventional bonding to achieve the hermetic package seals. The preferred material for these members is a forged copper zirconium alloy. A second suitable material, somewhat harder to fabricate, is of a copper-molybdenum-copper clad construction, proportioned to achieve CTE compatibility.

The term CTE compatibility has been chosen to include more than one CTE related design approach. In one approach, the CTEs of the dice and members of the package have closely matched CTEs, and the bonds uniting them are relatively unyielding. In another approach, significant differences in the CTEs may exist, while the bonds uniting them are yielding and thus reduce strains to the point where the reliability of the bond is not impaired.

In the preferred embodiment described, the CTE of silicon is 2.5, of molybdenum 5.0, and alumina 5.4. These numbers represent compatible CTEs for the construction described. The dimensions of the package as well as the temperature range that the package is designed to tolerate must also be taken into account. In general, smaller dice and smaller packages and lower temperature ranges allow for greater disparity in the CTEs of the components.

What is claimed is:

1. In combination:
    A) at least one die of a semiconductor material having one contact on the under surface and at least two contacts on the upper surface and constituting at least one semiconductor device;
    B) a compact hermetic surface mount package for said at least one semiconductor device comprising:
        1) a base of a metal having good thermal and electrical conductivity and Coefficient of Thermal Expansion compatible with that of said semiconductor material, said at least one die being attached to said base;
        2) a first apertured frame having a Coefficient of Thermal Expansion compatible with that of said base, sealed along the walls of the first aperture to said base, said aperture accommodating said at least one die;
        3) a second frame composed of an electrically insulating material and having a Coefficient of Thermal Expansion compatible with that of said first frame, said second frame having a second and a third aperture for upward passage of bond wires from said die with overhangs adjacent each aperture for bond wire attachment, and a first metallization coating the under surface sealed to the first frame along the walls of the first aperture and separate second and third metallizations coating the upper surface along the walls of s id second and third apertures for sealing and including said overhangs;
        4) at least two wire bonds, each connecting a device upper surface contact to one of said second and third metallizations on said overhangs;
        5) at least two apertured subframes, each having a Coefficient of Thermal Expansion compatible with that of said second frame and each being sealed along the walls of one of said second and third apertures to said second frame, each aperture accommodating a bond to an overhang; and
        6) at least two covers, each sealed to a subframe to close the package about said at least one semiconductor device,
    the covers and base providing at least three electrical connections to said semiconductor device.

2. The combination set forth in claim 1, wherein said first frame, said two subframes and said two covers are metallic.

3. The combination set forth in claim 1, wherein said base, said first frame, said two subframes and said two covers are of molybdenum.

4. The combination set forth in claim 1, wherein said second frame is of a ceramic material.

5. The combination set forth in claim 3, wherein said second frame is of alumina.

6. The combination set forth in claim 1, wherein said overhangs for wire bond attachment lie within vertical extensions of the boundaries of the at least one die limiting the additional package area over die area primarily to the wall thickness of said first aperture and thus minimizing the ratio of package area to die area.

7. The combination set forth in claim 1, wherein said at least one die is a single die, and wherein said at least one semiconductor device is a single three electrode semiconductor device.

8. The combination set forth in claim 1, wherein said at least one die is two dies and wherein said at least one semiconductor device is two diodes.

9. In combination:
A) at least one die of a semiconductor material having one contact on the under surface and at least two contacts on the upper surface and constituting at least one semiconductor device;
B) a compact hermetic surface mount package for said at least one semiconductor device comprising:
  1) a recessed base of a metal having good thermal and electrical conductivity and a Coefficient of Thermal Expansion compatible with that of said semiconductor material for accommodating said at least one die, said at least one die being secured within said recess;
  2) an apertured ceramic frame having a Coefficient of Thermal Expansion compatible with that of said base, said ceramic frame having a second and a third aperture for upward passage of bond wires from said die with overhangs adjacent each aperture for bond wire attachment, and a first metallization coating the under surface sealed to said recessed base around said recess and separate second and third metallizations coating the upper surface along the walls of said second and third apertures for sealing and including said overhangs;
  3) at least two wire bonds, each connecting a device upper surface contact to one of said second and third metallizations on said overhangs; and
  4) at least two recessed metallic covers, each recess thereof accommodating a bond to an overhang, each cover being sealed to said frame along the walls of one of said apertures to close the package about said at least one semiconductor device, each cover having a Coefficient of Thermal Expansion compatible with that of said apertured frame, the covers and base providing at least three electrical connections to said semiconductor device.

10. The combination set forth in claim 9, wherein said recessed base and recessed covers are of a deformable metal.

11. The combination set forth in claim 9, wherein said recessed base and said recessed covers are of copper based alloy.

12. The combination set forth in claim 9, wherein said recessed base and recessed covers are of a copper molybdenum copper clad construction.

13. The combination set forth in claim 9, wherein said ceramic frame is of alumina.

14. The combination set forth in claim 9, wherein said overhangs for wire bond attachment lie within vertical extensions of the boundaries of the at least one die limiting the additional package area primarily to thickness of walls of said recessed base and thus minimizing the ratio of package area to die area.

15. The combination set forth in claim 9, wherein said at least one die is a single die, and wherein said at least one semiconductor device is a single three electrode semiconductor device.

16. The combination set forth in claim 9, wherein said at least one die is two dies and wherein said at least one semiconductor device is two diodes.

* * * * *